US011121150B2

(12) United States Patent
Xiao et al.

(10) Patent No.: US 11,121,150 B2
(45) Date of Patent: Sep. 14, 2021

(54) THREE-DIMENSIONAL MEMORY DEVICES AND FABRICATING METHODS THEREOF

(71) Applicant: Yangtze Memory Technologies Co., Ltd., Wuhan (CN)

(72) Inventors: Li Hong Xiao, Wuhan (CN); Jun Liu, Wuhan (CN)

(73) Assignee: Yangtze Memory Technologies Co., Ltd., Hubei (CN)

( * ) Notice: Subject to any disclaimer, the term of this patent is extended or adjusted under 35 U.S.C. 154(b) by 65 days.

(21) Appl. No.: 16/243,787

(22) Filed: Jan. 9, 2019

(65) Prior Publication Data
US 2020/0168627 A1    May 28, 2020

Related U.S. Application Data

(63) Continuation of application No. PCT/CN2018/116940, filed on Nov. 22, 2018.

(51) Int. Cl.
*H01L 27/11582* (2017.01)
*H01L 21/8234* (2006.01)

(52) U.S. Cl.
CPC ............ *H01L 27/11582* (2013.01); *H01L 21/823462* (2013.01); *H01L 21/823487* (2013.01)

(58) Field of Classification Search
None
See application file for complete search history.

(56) References Cited

U.S. PATENT DOCUMENTS

| 8,854,855 | B2 | 10/2014 | Jung et al. | |
|---|---|---|---|---|
| 2013/0036827 | A1* | 2/2013 | Besling | G01L 9/0073 73/753 |
| 2015/0318298 | A1 | 11/2015 | Matsudaira et al. | |
| 2016/0043179 | A1* | 2/2016 | Noh | H01L 27/11582 257/315 |
| 2016/0126253 | A1 | 5/2016 | Lee et al. | |
| 2016/0240550 | A1* | 8/2016 | Jung | H01L 27/11568 |
| 2017/0243879 | A1* | 8/2017 | Yu | H01L 27/1157 |

(Continued)

FOREIGN PATENT DOCUMENTS

| CN | 105514109 A | 4/2016 |
|---|---|---|
| CN | 105679761 A | 6/2016 |
| CN | 106876403 A | 6/2017 |

(Continued)

OTHER PUBLICATIONS

International Search Report and Written Opinion of the International Searching Authority directed to related International Patent Application No. PCT/CN2018/116940, dated Jul. 29, 2019; 8 pages.

*Primary Examiner* — Xiaoming Liu
(74) *Attorney, Agent, or Firm* — Sterne, Kessler, Goldstein & Fox P.L.L.C.

(57) ABSTRACT

A method for forming a gate structure of a 3D memory device is provided. The method comprises: forming an alternating layer stack on a substrate; forming a plurality of channel holes in the alternating layer stack, each penetrating vertically through the alternating layer stack; forming a functional layer including a storage layer on a sidewall of each channel hole, wherein the storage layer has an uneven surface; forming a channel layer to cover the functional layer in each channel hole; and forming a filling structure to cover the channel layer and fill each channel hole.

9 Claims, 11 Drawing Sheets

(56) References Cited

U.S. PATENT DOCUMENTS

2018/0033799 A1    2/2018    Kanamori et al.

FOREIGN PATENT DOCUMENTS

| CN | 106920772 A | 7/2017 |
| CN | 107665895 A | 2/2018 |
| CN | 108447870 A | 8/2018 |
| CN | 108511454 A | 9/2018 |
| KR | 2014/0050862 A | 4/2014 |

* cited by examiner

THREE-DIMENSIONAL MEMORY DEVICES AND FABRICATING METHODS THEREOF

CROSS-REFERENCE TO RELATED APPLICATIONS

This application claims priority to PCT Application No. PCT/CN2018/116940, filed on Nov. 22, 2018, which is incorporated herein by reference in its entirety.

BACKGROUND

Embodiments of the present disclosure relate to three-dimensional (3D) memory devices and fabrication methods thereof.

Planar memory cells are scaled to smaller sizes by improving process technology, circuit designs, programming algorithms, and fabrication processes. However, as feature sizes of the memory cells approach a lower limit, planar processes and fabrication techniques become challenging and costly. As a result, memory density for planar memory cells approaches an upper limit.

A 3D memory architecture can address the upper density limitation in planar memory cells. The 3D memory architecture includes a memory array and peripheral devices for controlling signals to and from the memory array.

BRIEF SUMMARY

Embodiments of method for forming gate structures of 3D memory devices and fabrication methods thereof are disclosed herein.

Disclosed is a method for forming a three-dimensional (3D) NAND memory device, comprising: forming an alternating layer stack on a substrate; forming a plurality of channel holes in the alternating layer stack, each penetrating vertically through the alternating layer stack; forming a functional layer including a storage layer on a sidewall of each channel hole, wherein the storage layer has an uneven surface; forming a channel layer to cover the functional layer in each channel hole; and forming a filling structure to cover the channel layer and fill each channel hole.

In some embodiments, the method further comprises dividing the storage layer into a plurality of segments.

In some embodiments, forming the alternating layer stack comprises forming a plurality of conductive/dielectric layer pairs on the substrate, each conductive/dielectric layer pair comprising a conductive layer and a dielectric layer.

In some embodiments, the method further comprises, before forming the functional layer, etching portions of the dielectric layers exposed by the channel holes to form a plurality of recesses on the sidewall of each channel hole.

In some embodiments, the method further comprises forming a slit penetrating vertically through the alternating layer stack and extending in a horizontal direction; removing the dielectric layers in the alternating layer stack through the slit to form a plurality of horizontal trenches; and forming an insulating layer to cover exposed surfaces of the conductive layers and the functional layer.

In some embodiments, the method further comprises, before forming the insulating layer, removing portions of the functional layer exposed by the multiple horizontal trenches to divide the storage layer into a plurality of segments.

In some embodiments, the method further comprises after forming the slit, forming a doped region below the slit in the substrate; after forming the insulating layer, removing a portion of the insulating layer at a bottom of the silt to expose the doped region; and forming a conductive wall in the silt, so as to electrically contact the conductive wall with the doped region.

In some embodiments, the method further comprises, before forming the functional layer, forming a plurality of recesses on the sidewall of each channel hole.

In some embodiments, forming the functional layer comprises forming a barrier layer on the sidewall of each channel hole for blocking an outflow of the electronic charges during operation; forming the storage layer on a surface of the barrier layer for storing electronic charges during operation; and forming a tunneling layer on a surface of the storage layer for tunneling electronic charges during operation.

In some embodiments, forming the barrier layer comprises forming the barrier layer to cover the sidewall of each channel hole, such that the barrier layer includes a plurality of first corners corresponding to the plurality of recesses on the sidewall of each channel hole.

In some embodiments, forming the storage layer comprises forming the storage layer to cover the barrier layer, such that the storage layer includes a plurality of second corners corresponding to the plurality of first corners of the barrier layer.

In some embodiments, forming the tunneling layer comprises forming the tunneling layer to cover the storage layer, such that the tunneling layer includes a plurality of protrusions each corresponding to a recess on the sidewall of each channel hole.

Another aspect of the present disclosure provides a three-dimensional (3D) NAND memory device, comprising: an alternating layer stack disposed on a substrate; a plurality of channel holes in the alternating layer stack, each penetrating vertically through the alternating layer stack; a functional layer disposed on a sidewall of each channel hole, wherein the functional layer includes a storage layer having an uneven surface; a channel layer disposed to cover the functional layer in each channel hole; and a filling structure disposed to cover the channel layer and fill each channel hole.

In some embodiments, the storage layer includes a plurality of divided segments.

In some embodiments, the alternating layer stack comprises a plurality of conductive/dielectric layer pairs each comprising a conductive layer and a dielectric layer.

In some embodiments, the alternating layer stack comprises a plurality of conductive layers covered by an insulating layer, and a plurality of air gaps between adjacent conductive layers.

In some embodiments, the device further comprises a slit penetrating vertically through the alternating layer stack and extending in a horizontal direction; a doped region in the substrate located adjacent to the slit; and a conductive wall in the silt and in contact with the doped region.

In some embodiments, the functional layer comprises: a barrier layer disposed on the sidewall of each channel hole and configured to blocking an outflow of the electronic charges during operation; the storage layer disposed on a surface of the barrier layer and configured to storing electronic charges during operation; and a tunneling layer disposed on a surface of the storage layer and configured to permit tunneling of electronic charges during operation.

In some embodiments, the barrier layer comprises a plurality of first corners corresponding to the plurality of recesses on the sidewall of each channel hole; the storage layer includes a plurality of second corners corresponding to the plurality of first corners of the barrier layer; and the tunneling layer includes a plurality of protrusions each corresponding to a recess on the sidewall of each channel hole.

In some embodiments, the barrier layer includes an $Al_2O_3$ sublayer and a $SiO_2$ sublayer; the storage layer includes a first SiN sublayer, a first SiON sublayer, a second SiN sublayer, a second SiON sublayer, and a third SiN sublayer; and the tunneling layer includes a first SiO sublayer, a first SiON sublayer, a second SiON sublayer, a third SiON sublayer, and a second SiO sublayer.

Other aspects of the present disclosure can be understood by those skilled in the art in light of the description, the claims, and the drawings of the present disclosure.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

Figure 1:
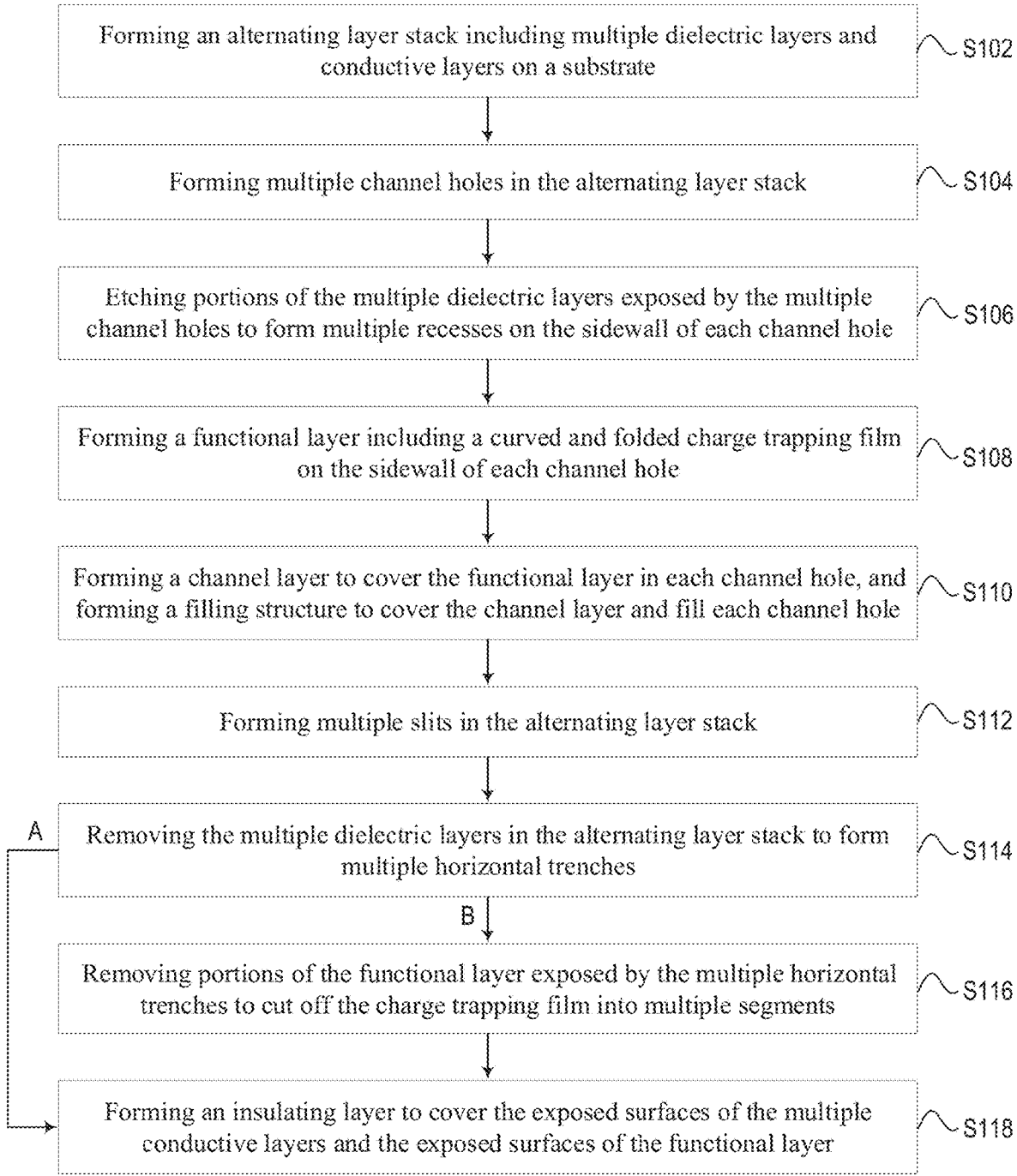
FIG. 1 illustrates a flow diagram of an exemplary method for forming a 3D memory device, according to some embodiments of the present disclosure.

Embodiments of the present disclosure will be described with reference to the accompanying drawings.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to effect such feature, structure or characteristic in connection with other embodiments whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure, or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnection layer can include one or more conductor and contact layers (in which contacts, interconnect lines, and/or vias are formed) and one or more dielectric layers.

As used herein, the term "nominal/nominally" refers to a desired, or target, value of a characteristic or parameter for a component or a process operation, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±2.0%, or +30% of the value).

As used herein, the term "3D memory device" refers to a semiconductor device with vertically-oriented strings of memory cell transistors (i.e., region herein as "memory strings," such as NAND strings) on a laterally-oriented substrate so that the memory strings extend in the vertical direction with respect to the substrate. As used herein, the term "vertical/vertically" means nominally perpendicular to a lateral surface of a substrate.

In a 3D NAND memory device, memory cells for storing data are embedded in a stack of word lines (control gate electrodes and the semiconductor channels formed through the stack. Each word line is separately from adjacent word lines by dielectric layers, and is connected to a metal contact via, which is further connected to a metal interconnect and an external circuit (e.g., control circuit), so that cell operations, including programing, reading, writing and erasing data in the memory cells can be controlled from the external circuit. However, as more word-lines and dielectric layers are stacked vertically, cell operations become more and more challenging, for which data retention characteristic is one of the key challenges that needs to be improved and/or managed. Specifically, several mechanisms, such as lateral charge loss by spreading along a charge trapping film (CTF) in a functional layer of the semiconductor channels, vertical charge loss by a quick charge detrapping through a thinner tunneling film in the functional layer of semiconductor channels, temperature variation during a regular acceleration test, etc., can cause a poor performance of the semiconductor channels, thereby harm the data retention characteristic. Accordingly, the disclosed method for forming a 3D memory device includes forming a CTF of an uneven surface in a functional layer of the cell structure. The CTF can also be divided into multiple segments. As such, the charge lateral spreading along the CIF can be effectively inhibited, thereby significantly improving the cell operation speed and the data retention performance.

FIG. 1 illustrates a flow diagram of an exemplary method for forming a 3D memory device, according to some embodiments of the present disclosure. FIGS. 2-9 illustrate schematic cross-sectional views of an exemplary 3D memory device at certain fabricating stages of the method shown in FIG. 1 according to some embodiments of the present disclosure. It is noted that, the disclosed method can be applied to either gate-first formation or gate-last formation. In the present disclosure, a gate-first formation process is used as an example in connection with FIGS. 1-9 to demonstrate the disclosed method.

Figure 2:
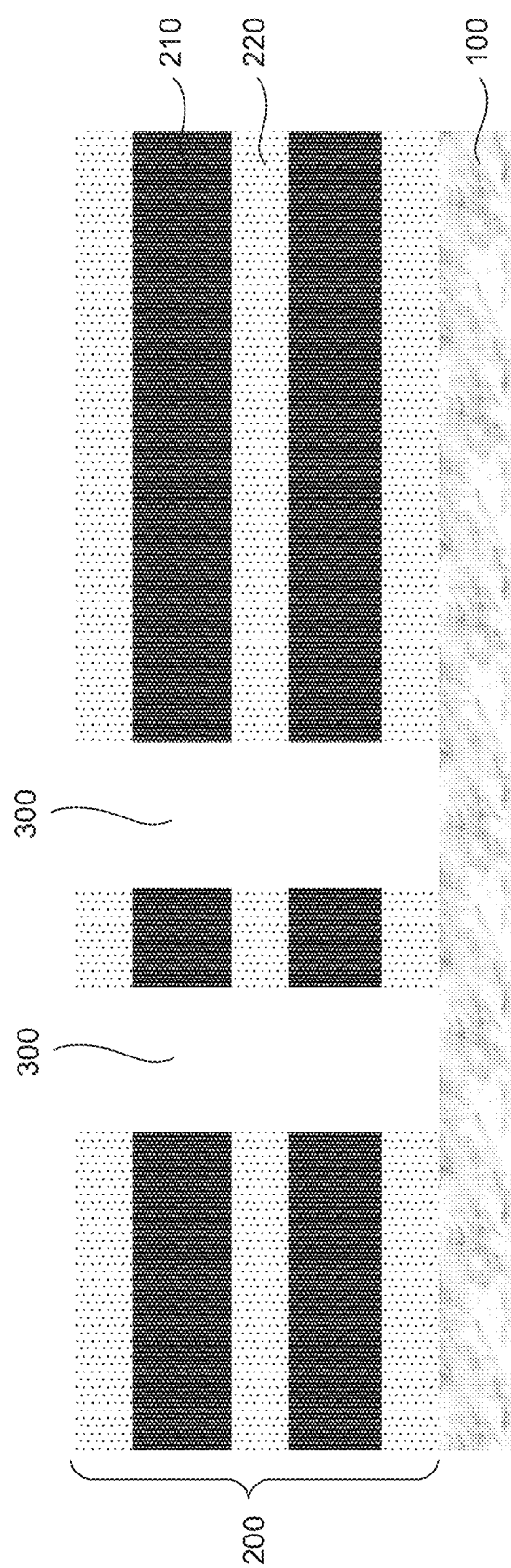
FIGS. 2-9 illustrate schematic cross-sectional views of an exemplary 3D memory device at certain fabricating stages of the method shown in FIG. 1 according to some embodiments of the present disclosure.

As shown in FIG. 1, the method starts at operation S102, in which an alternating layer stack including a plurality of conductive/dielectric layer pairs can be formed on a substrate. As shown in FIG. 2, in some embodiments, the substrate 100 can be any suitable semiconductor substrate having any suitable structure, such as a monocrystalline single-layer substrate, a polycrystalline silicon (polysilicon) single-layer substrate, a polysilicon and metal multi-layer substrate, etc. For example, the substrate 100 can be a p-type silicon substrate.

As shown in FIG. 2, an alternating layer stack 200 including a plurality of conductive/dielectric layer pairs can be formed on the substrate 100. Each conductive/dielectric layer pairs of the alternating layer stack 200 can include an alternating stack of a conductive layer 210 and a dielectric layer 220. The plurality of conductive/dielectric layer pairs are also referred to herein as an "alternating conductive/dielectric stack." That is, in the alternating layer stack 200, multiple conductive layers 210 and multiple dielectric layers 220 alternate in a vertical direction. In other words, except a top and a bottom layer of a given alternating oxide/nitride stack, each of the other conductive layers 210 can be sandwiched by two adjacent dielectric layers 220, and each of the dielectric layers 220 can be sandwiched by two adjacent conductive layers 210.

In some embodiments, the conductive layers 210 can include any suitable conductive material. For example, the conductive layers 210 can be heavily doped polysilicon layers. In some embodiments, the dielectric layers 330 can include any suitable dielectric material. For example, the dielectric layers 330 can be silicon nitride layers. The alternating layer stack 200 can be formed by one or more thin film deposition processes including, but not limited to, Chemical Vapor Deposition (CVD), Physical Vapor Deposition (PVD), Atomic Layer Deposition (ALD), or any combination thereof.

The plurality of conductive layers 210 and dielectric layers 220 are extended in a lateral direction that is parallel to a surface of the substrate 100. The conductive layers 210 can each have the same thickness or have different thicknesses. For example, a thickness of each conductive layer 210 can be in a range from about 10 nm to about 150 nm. Similarly, the dielectric layers 220 can each have the same thickness or have different thicknesses. For example, a thickness of each dielectric layer 220 can be in a range from about 10 nm to about 150 nm. In some embodiments, a total thickness of the alternating layer stack 200 can be larger than 1000 nm. It is noted that, the thickness ranges are provided for illustration, and should not be construed to limit the scope of the appended claims.

The alternating layer stack 200 can include any suitable number of layers of the conductive layers 210 and the dielectric layers 220. In some embodiments, a total number of layers of the conductive layers 210 and the dielectric layers 220 in the alternating layer stack 200 is equal to or larger than 64. That is, a number of conductive/dielectric layer pairs can be equal to or larger than 32. In some embodiments, there are more layers than the conductive/dielectric layer pairs with different thicknesses in the alternating layer stack 200. For example, a bottom layer and a top layer in the alternating layer stack 200 can be dielectric layers 220.

As shown in FIG. 1, the method proceeds to operation S104, in which multiple channel holes can be formed in the alternating layer stack.

As shown in FIG. 2, multiple channel holes 300 can be formed in the alternating layer stack 200. In some embodiments, the multiple channel holes 300 can be arranged as an array in the alternating layer stack 200. Each channel hole 300 can extend vertically through the alternating layer stack 200. The channel hole 300 can have a high aspect ratio, and can be formed by etching the alternating layer stack 200. In some embodiments, the multiple channel holes 300 can be formed by forming a mask layer over the alternating layer stack 200 and patterning the mask using, e.g., photolithography, to form openings corresponding to the multiple channel holes in the patterned mask layer. A suitable etching process, e.g., a wet etching, a dry etching, or a combination thereof, can be performed to remove portions of the alternating layer stack 200 exposed by the openings until the multiple channel holes 300 expose the substrate 100. The mask layer can be removed after the formation of the multiple channel holes 300.

As shown in FIG. 1, the method proceeds to operation S106, in which portions of the multiple dielectric layers exposed by the multiple channel holes can be etched to form multiple recesses on the sidewall of each channel hole.

Figure 3:
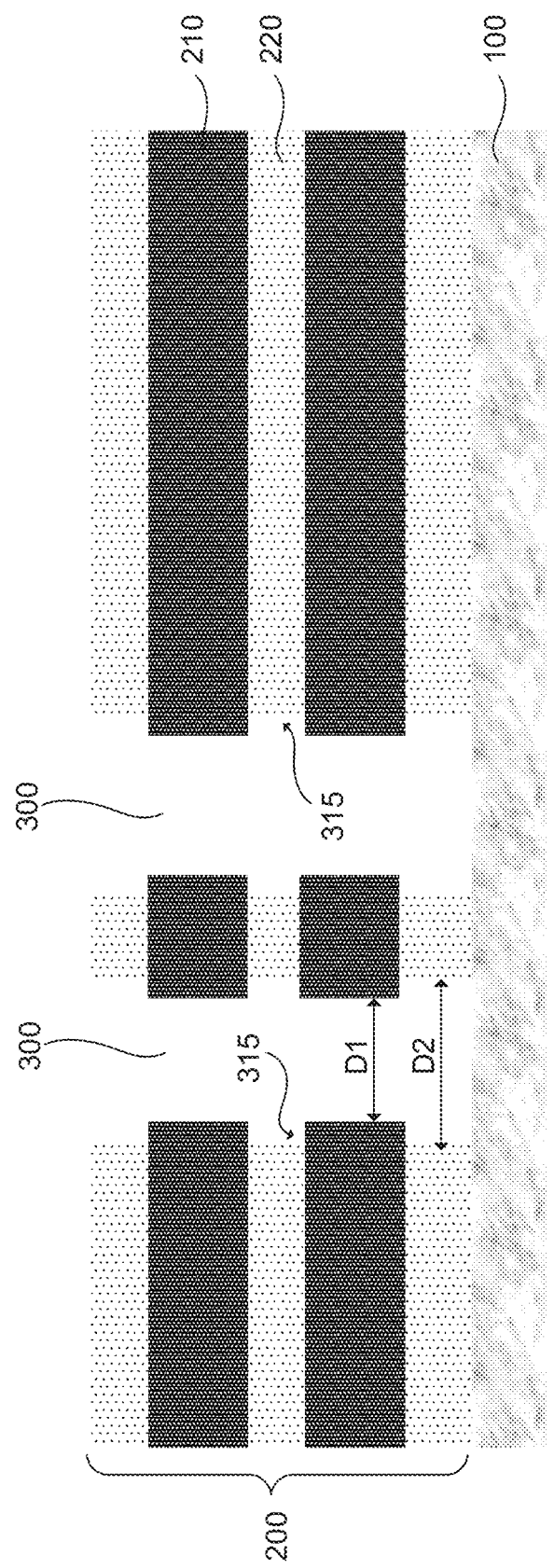

As shown in FIG. 3, portions of the dielectric layers 220 of the alternating layer stack 200 on the sidewall of each channel hole 300 can be removed by used any suitable etching process, e.g., an isotropic dry etch or a wet etch. The etching process can have sufficiently high etching selectivity of the material of the dielectric layers 220 over the materials of the conductive layer 210, such that the etching process can have minimal impact on the conductive layer 210. The isotropic dry etch and/or the wet etch can remove portions of the dielectric layers 220 that are exposed by the multiple channel holes 300. As such, multiple recesses 315 can be formed on the sidewall of each channel hole 300. Thus, the operation S106 can also be referred as a dielectric layer recess etch.

As shown in FIG. 3, each recess 315 can have a horizontal hollow ring shape, with an outer sidewall as the dielectric layer 220 as well as a top wall and a bottom wall as the conductive layers 210. That is, each channel hole 300 can have uneven inner diameters. In some embodiments, at the first portions of the channel hole 300 where the conductive layers 210 are the sidewall of the channel hole 300, the first inner diameter D1 of the channel hole 300 can be in a range from about 50 nm to about 200 nm. At the second portions of the channel hole 300 where the conductive layers 210 are the sidewall of the channel hole 300, the second inner diameter D2 of the channel hole 300 can be in a range from about 60 nm to about 220 nm. In some embodiments, the second inner diameter D2 of the channel hole 300 can be about 10% to about 20% larger than the first inner diameter D1 of the channel hole 300. It is noted that, the above mentioned size ranges and portion ranges are used for examples only, which do not limit the scope of the present disclosure. In actual practice, the sizes of D1 and D2 can be determined by channel hole layout, bit line layout, and pitch density, word line connection, etc.

As shown in FIG. 1, the method proceeds to operation S108, in Which a functional layer including a curved and folded charge trapping film (CTF) can be formed on the sidewall of each channel hole.

In some embodiments, before forming the functional layer, an epitaxial layer (not shown in the drawings) can be formed at a bottom of each channel hole 300. In some embodiments, the epitaxial layer can be a polycrystalline silicon (polysilicon) layer formed by using a selective epitaxial growth (SEG) process. For example, an SEG pre-clean process can be performed to clean the multiple channel holes 300. A following deposition process can be performed to form a polysilicon layer at the bottom of each channel hole 300. In some embodiments, any suitable doping process, such as an ion metal plasma (IMP) process, can be performed on the polysilicon layer to form the epitaxial layer. In some embodiments, the epitaxial layer may be not directly formed on the surface of the substrate 100. One or more layers can be formed between the epitaxial layer and the substrate 100.

Figure 4:
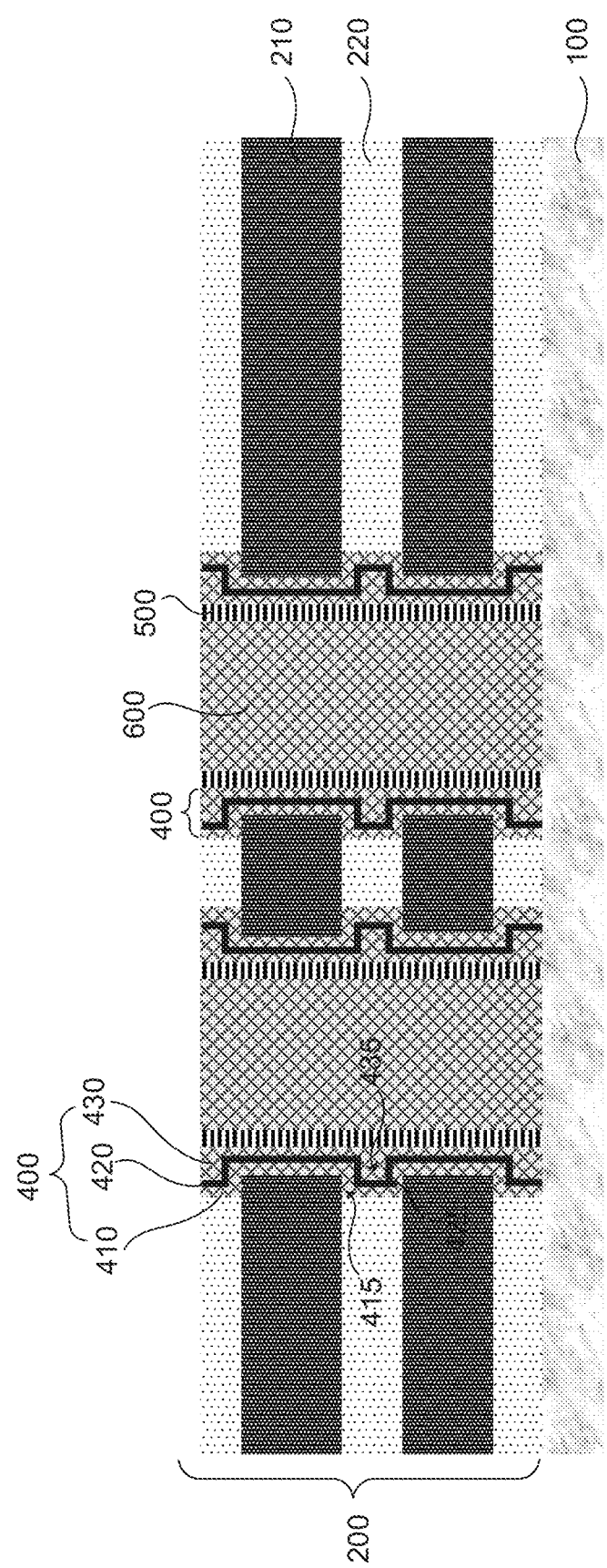

As shown in FIG. 4, a functional layer 400 can be formed on the sidewall of each channel hole 300. The functional layer 400 can be a composite dielectric layer, such as a combination of a barrier layer 410, a storage layer 420, and a tunneling layer 430. In some embodiments, each of the barrier layer 410, the storage layer 420, and the tunneling layer 430, can be a composite dielectric layer, and can be formed by one or more thin film deposition processes, such as ALD, CVD, PVD, any other suitable processes, or any combination thereof.

Figure 10:
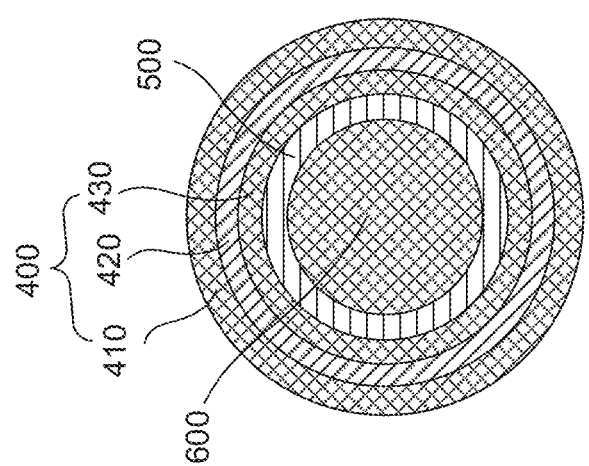
FIG. 10 illustrates a schematic top view of an exemplary channel structure of a 3D memory device according to some embodiments of the present disclosure.
Figure 11:
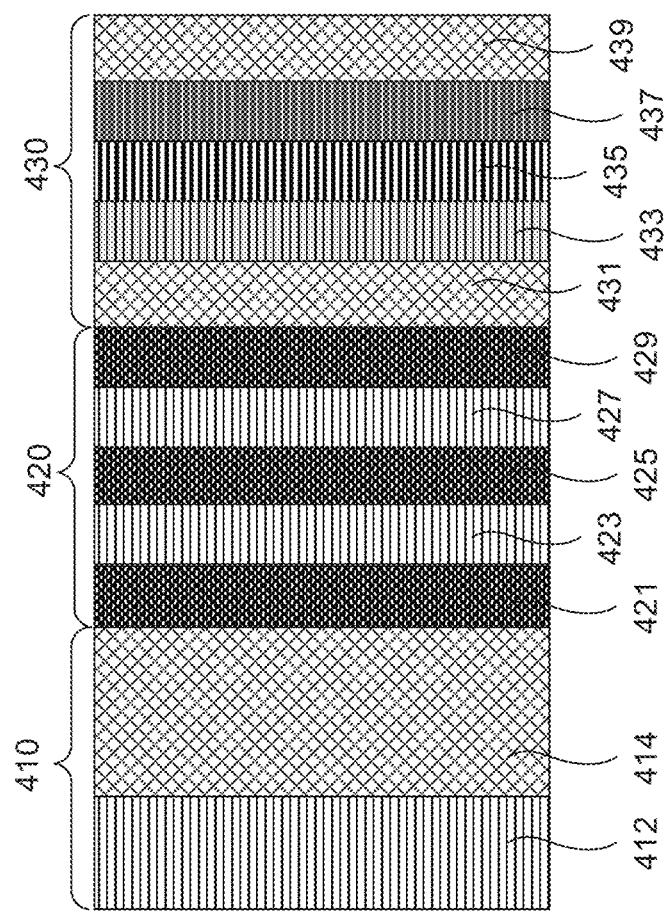
FIG. 11 illustrates a schematic cross-sectional view of an exemplary functional layer of a 3D memory device according to some embodiments of the present disclosure.

The shape and the structure of the functional layer 400 can also be referred to FIGS. 10 and 11. FIG. 10 illustrates a schematic top view of an exemplary channel structure of a 3D memory device according to some embodiments of the present disclosure. FIG. 11 illustrates a schematic cross-sectional view of an exemplary functional layer of a 3D memory device according to some embodiments of the present disclosure. As shown in FIG. 10, the functional layer 400 including the barrier layer 410, the storage layer 420, and the tunneling layer 430 can have a ring structure in lateral plane.

As shown in FIG. 4, the barrier layer 410 can be formed on the sidewall of each channel hole 300. Since the sidewall of each channel hole 300 includes multiple recesses 315, the barrier layer 410 formed on the sidewall of each channel hole 300 can have an uneven surface. For example, as shown in FIG. 4, the barrier layer 410 conforms to the shape of the uneven sidewall of each channel hole 300. In a vertical direction, the barrier layer 410 can includes multiple first corners 415. In some embodiments, a thickness of the barrier layer 410 can be in a range from about 3 nm to about 20 nm.

The barrier layer 410 can be used for blocking the outflow of the electronic charges. In some embodiments, the barrier layer 410 can be a silicon oxide layer or a combination of silicon oxide/silicon nitride/silicon oxide (ONO) layers. In some embodiments, the barrier layer 410 includes high dielectric constant (high k-value) dielectrics (e.g., aluminum oxide). For example, as shown in FIG. 11, the barrier layer 410 can include an $Al_2O_3$ sublayer 412, a $SiO_2$ sublayer 414, and an optional SiON sublayer (not shown). In some embodiments, the storage layer 420 including multiple sublayers can be formed by using multiple deposition processes.

As shown in FIG. 4, the storage layer 420 can be formed to cover the barrier layer 410. Since the sidewall of each channel hole 300 includes multiple recesses 315 and the barrier layer 410 includes multiple first corners 415, the storage layer 420 formed on the barrier layer 410 can also have an uneven surface. For example, as shown in FIG. 4, the storage layer 420 conforms to the shape of the uneven surface of the barrier layer 410. In a vertical direction, the storage layer 420 can includes multiple second corners 425. In some embodiments, a thickness of the storage layer 420 can be in a range from about 3 nm to about 20 nm.

During the operation of the 3D memory device, electrons or holes from the channel layer 500 can tunnel to the storage layer 420 through the tunneling layer 430. The storage layer 420 can be used for storing electronic charges (electrons or holes) for memory operation, and can be also referred as a charge trapping film (CTF). The storage or removal of charge in the storage layer 420 can impact the on/off state and/or a conductance of the semiconductor channel. In some embodiments, the curved and folded shape of the storage layer 420 can decrease charge lateral spreading along the storage layer 420, thereby reducing Charge loss in CTF.

The storage layer 420 can include one or more films of materials including, but are not limited to, silicon nitride, silicon oxynitride, a combination of silicon oxide and silicon nitride, or any combination thereof. For example, as shown in FIG. 11, the storage layer 420 can include a first SiN sublayer 421, a first SiON sublayer 423, a second SiN sublayer 425, a second SiON sublayer 427, and a third SiN sublayer 429. In some embodiments, the storage layer 420 including multiple sub-layers can be formed by using multiple deposition processes.

As shown in FIG. 4, the tunneling layer 430 can be formed to cover the storage layer 420. Since the sidewall of each channel hole 300 includes multiple recesses 315 and the storage layer 420 includes multiple second corners 425, the tunneling layer 430 formed on the storage layer 420 conforms to the shape of the uneven surface of the storage layer 420. For example, the storage layer 420 can have multiple protrusions 435 each corresponding to one recess 315 of the dielectric layer 220. In some embodiments, a thickness of the tunneling layer 430 can be in a range from about 3 nm to about 20 nm.

The tunneling layer 430 can be used for tunneling electronic charges (electrons or holes). The tunneling layer 430 can include dielectric materials including, but not limited to, silicon oxide, silicon nitride, silicon oxynitride, or any combination thereof. For example, as shown in FIG. 11, the tunneling layer 430 can include a first SiO sublayer 431, a first SiON sublayer 433, a second SiON sublayer 435, a third SiON sublayer 437, and a second SiO sublayer 439. In some embodiments, a nitrogen concentration can be increased following a certain gradient from the first SiON sublayer 433 to the second SiON sublayer 435, and to third SiON sublayer 437. In some embodiments, the tunneling layer 430 including multiple sub-layers can be formed by using multiple deposition processes As shown in FIG. 1, the method proceeds to operation S110, in which a channel layer can be formed to cover the functional layer in each channel hole, and a filling structure can be formed to cover the channel layer and fill each channel hole.

As shown in FIG. 4, a channel layer 500 can be formed in each channel hole 300 to covering the sidewall of the functional layer 400. In some embodiments, the channel layer 500 can be an amorphous silicon layer or a poly silicon layer formed by using a thin film deposition process, such as ALD, CND, PVD, or any other suitable process. In some embodiments, the channel layer 500 can be in contact with the epitaxial layer. In some embodiments, a thickness of the channel layer 500 can be in a range from about 5 nm to 20 nm.

In some embodiments, a filling structure 600 can be formed in each channel hole 300 to cover the channel layer 500 and fill the channel hole 300. In some embodiments, the filling structure 500 can be an oxide layer formed by using any suitable deposition process, such as ALD, CND, PVD, etc. In some embodiments, the filling structure 500 can include one or more airgaps. In some embodiments, a channel plug (not shown in figures) can be formed on top of the filling structure 600. The channel plug can be in contact with the channel layer 500. The material of the channel plug can include any suitable conductive material, such as Si, W, etc. The channel plug can be formed by using any suitable deposition process, and a following chemical-mechanical planarization (CMP) process.

Figure 5:
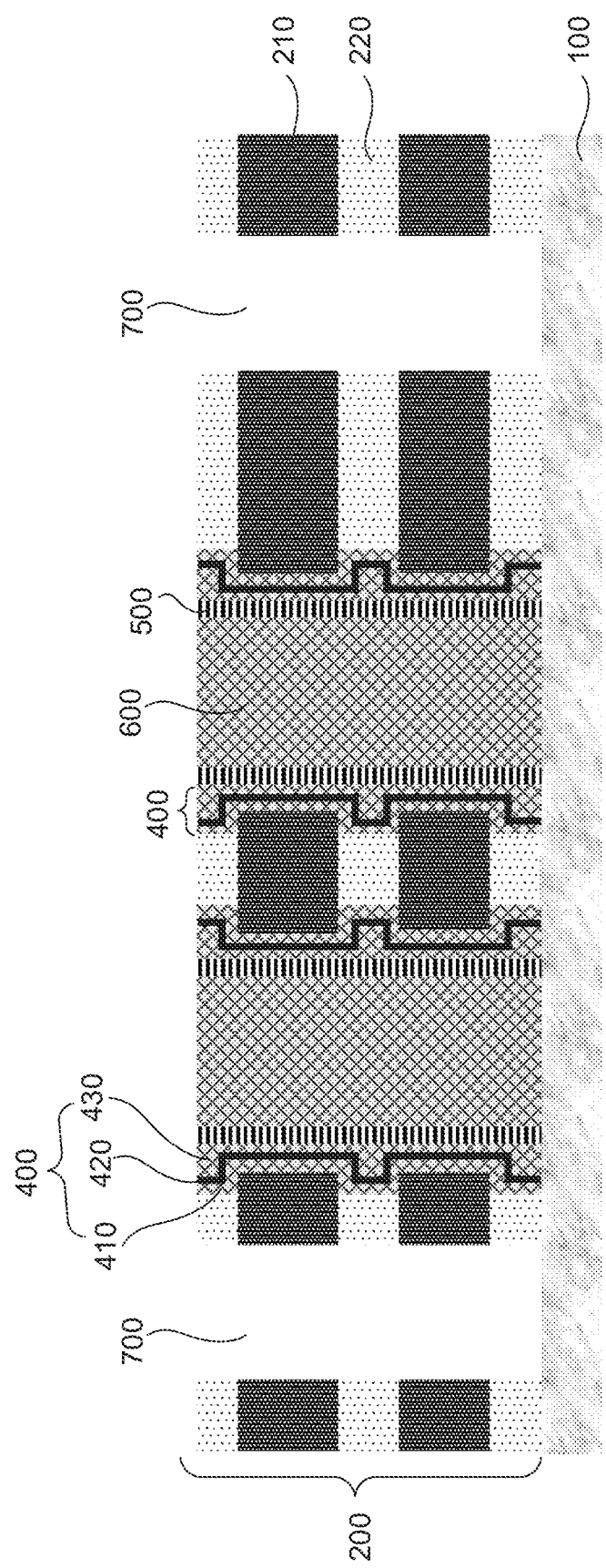

As shown in FIG. 1, the method proceeds to operation S112, in which multiple slits can be formed in the alternating layer stack. As shown in FIG. 5, each slit 700 can vertically penetrate through the alternating layer stack 200, and laterally extend substantially in a straight line between two arrays of channel structures. The multiple slits 700 can be formed by forming a mask layer over the alternating layer stack 200 and patterning the mask using, e.g., photolithography, to form openings corresponding to the multiple slits in the patterned mask layer. A suitable etching process, e.g., dry etch and/or wet etch, can be performed to remove portions of the alternating layer stack 200 exposed by the openings until the multiple slits 700 expose the substrate 100. The mask layer can be removed after the formation of the multiple slits.

In some embodiments, a doped region (not shown in figures) can be formed at a bottom of each silt 700 by using any suitable doping process, such as ion implantation and/or thermal diffusion through the slits 700. The dopant in doped region can be any suitable N+ or P+ ions. After forming a conductive wall in each silt 700 in a subsequent process, the lower end of each conductive wall can be in contact with a corresponding doped region. It is understood that doped regions can be formed in an earlier fabrication stage, for example, prior to the formation of the multi-layer gate structure, according to some embodiments.

Figure 6:
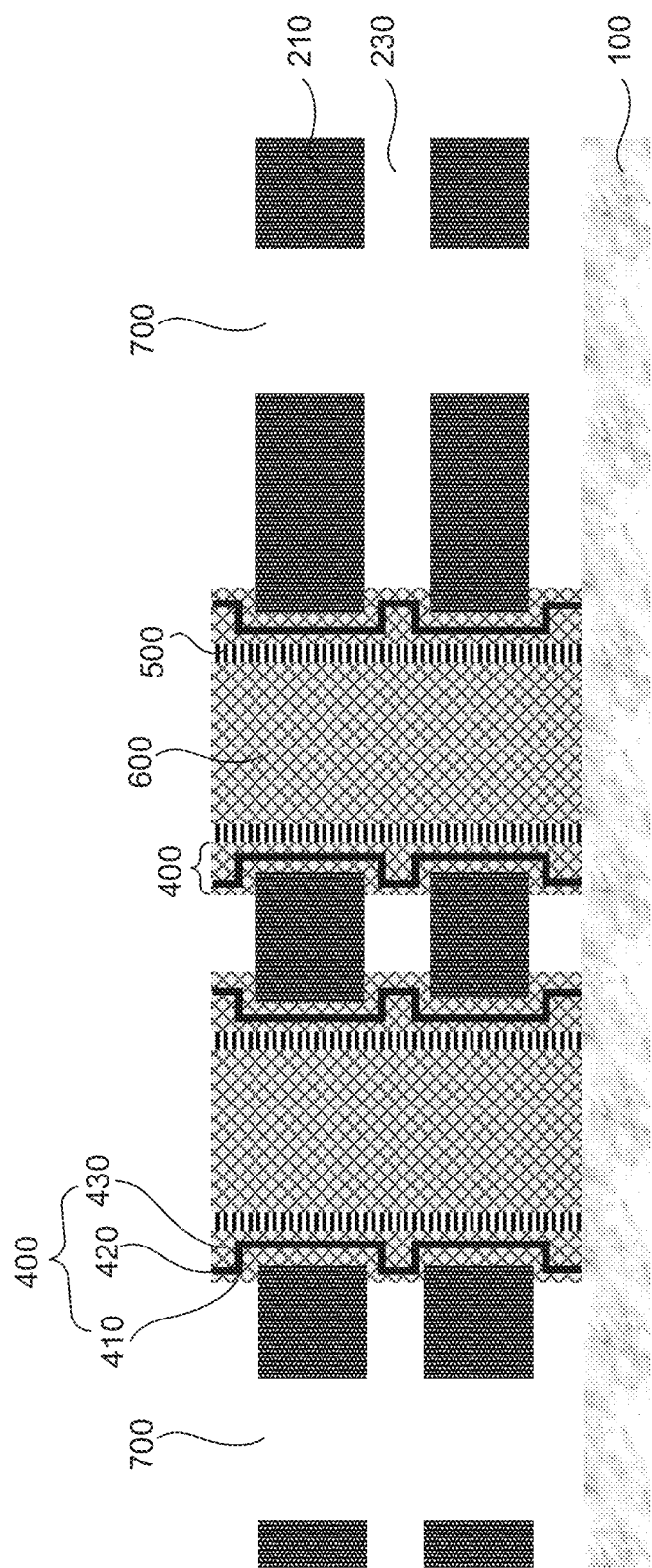

As shown in FIG. 1, the method proceeds to operation S114, in which the multiple dielectric layers 220 in the alternating layer stack 200 can be removed to form multiple horizontal trenches 230. As shown in FIG. 6, the multiple horizontal trenches 230 can extend in a horizontal direction. It is noted that, the term "horizontal/horizontally" used herein means nominally parallel to a lateral surface of a substrate.

In some embodiments, the dielectric layers 220 in the alternating layer stack 200 are used as sacrificial layers, and are removed by used any suitable etching process, e.g., an isotropic dry etch or a wet etch. The etching process can have sufficiently high etching selectivity of the material of the dielectric layers 220 over the materials of the conductive layers 210, such that the etching process can have minimal impact on the conductive layers 210. The isotropic dry etch and/or the isotropic wet etch can remove dielectric layers 220 in various directions to expose the top and bottom surfaces of each conductive layer 210. As such, multiple horizontal trenches 230 can then be formed between adjacent conductive layers 210.

In some embodiments, the dielectric layers 220 include silicon oxide and the inter metal dielectric removal can be an isotropic wet etching process. The etchant of the isotropic wet etch includes diluted HF. In some embodiments, the dielectric layers 220 include silicon nitride and the etchant of the isotropic wet etch includes phosphoric acid, such as $H_3PO_4$.

After the dielectric layers 220 are removed, the multiple slits 700 and multiple horizontal trenches 230 can be cleaned by using any suitable cleaning process. For example, a wet etch cleaning process can be performed to remove native oxide at the bottom of the slits 700 and a dry etch cleaning process can be performed to remove polymer and by-products on the sidewall of the slits. After the cleaning process, the top surfaces 212 and bottom surfaces 214 of the conductive layers 210, and portions of the outside sidewalls of the functional layers 310 originally surrounded by the dielectric layers 220 can be exposed through the multiple horizontal trenches 230, as shown in FIG. 6.

As shown in FIG. 1, in some embodiments, after operation S114, the method optionally directly proceeds to operation S118 (option A), in which an insulating layer can be formed to cover the exposed surfaces of the multiple conductive layers and the exposed surfaces of the functional layer. The insulating layer can be used as a gate dielectric layer for insulating the respective conductive layers (e.g., also referred as word lines or gate electrodes).

Figure 7:
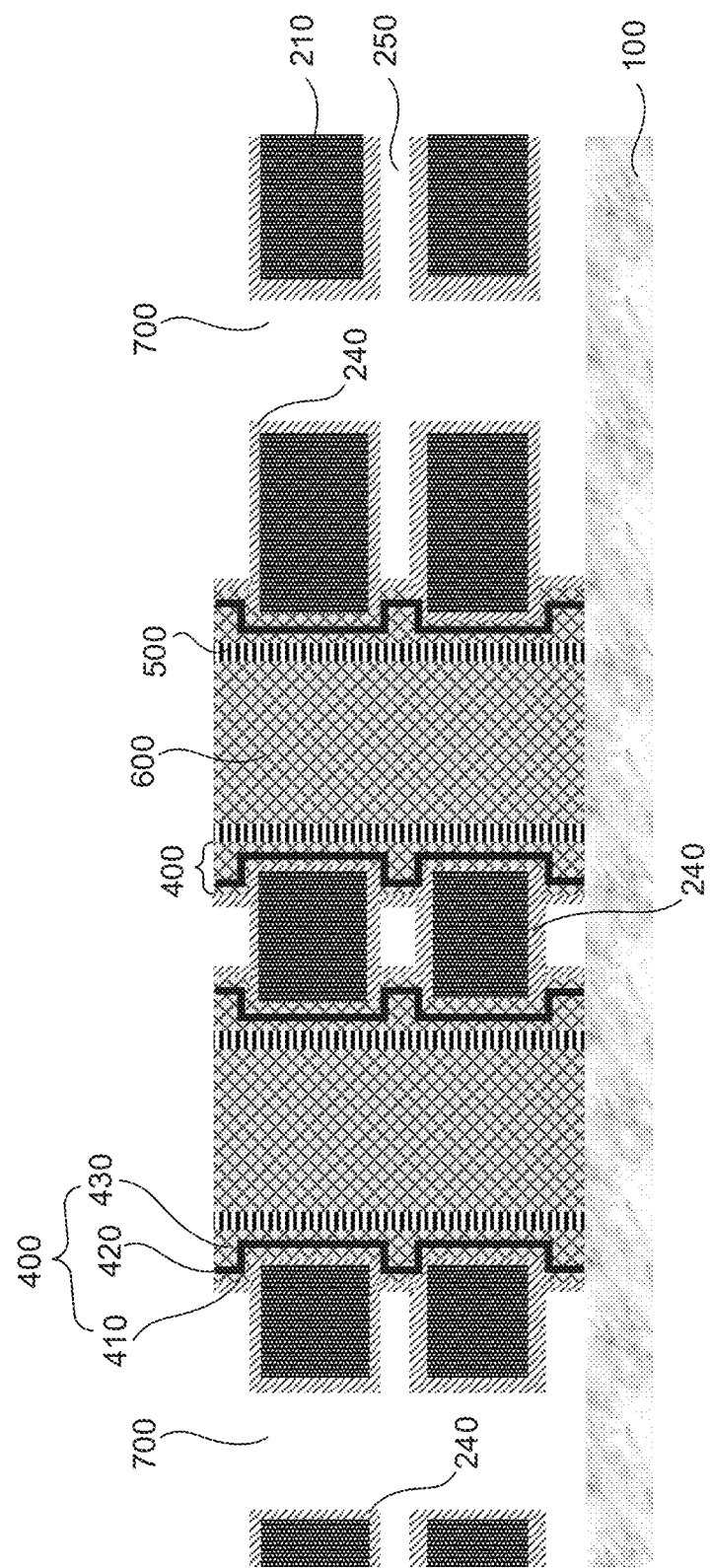

As shown in FIG. 7, in some embodiments, the insulating layer 240 can be formed to cover the exposed surfaces of the multiple conductive layers 210 and the exposed surfaces of the functional layer 400 with one or more suitable insulating materials. For example, one or more suitable deposition processes, such as CVD, PVD, and/or ALD, can be utilized to deposit the one or more insulating materials into the horizontal trenches 230 from the slits 700.

In some embodiments, the one or more insulating materials of the insulating layer 240 can include any suitable materials that provide electric insulating function. For example, the one or more insulating materials can include one or more from silicon oxide, silicon nitride, silicon oxynitride, and high k-value dielectric materials, such as aluminum oxide ($Al_2O_3$), hafnium dioxide ($HFO_2$), Tantalum pentoxide ($Ta_2O_5$), titanium nitride (TiN), etc., and/or any suitable combinations thereof. In some embodiments, the insulating layer 240 can be a single film structure, or include multiple insulating sublayers each having different insulating materials.

In some embodiments, the insulating layer 240 can be formed by oxidizing the exposed surfaces of the multiple conductive layers 210. For example, the multiple conductive layers 210 are poly silicon layers, and a dry oxygen oxidation process or a wet oxygen oxidation process can be performed to oxidize the exposed surfaces of the poly silicon layers to form a SiO layer as the insulating layer 240. In some other embodiments, the insulating layer 240 can be formed by one or more suitable deposition processes, such as CVD, ALD, etc.

In some embodiments, a thickness of the titanium nitride film can be in a range from about 1 nm to about 10 nm. In some embodiments, air gaps 250 can be formed in the spaces between the adjacent conductive layers 210, as shown in FIG. 7. In some other embodiments, the spaces between the adjacent conductive layers 210 can be filled with one or more suitable dielectric materials.

As shown in FIG. 1, in some embodiments, before the operation S118 for forming the insulating layer, the method optionally proceeds to operation S116 (option B), in which portions of the functional layer exposed by the multiple horizontal trenches can be removed, such that the CTF in the functional layer is divided into multiple segments.

Figure 8:
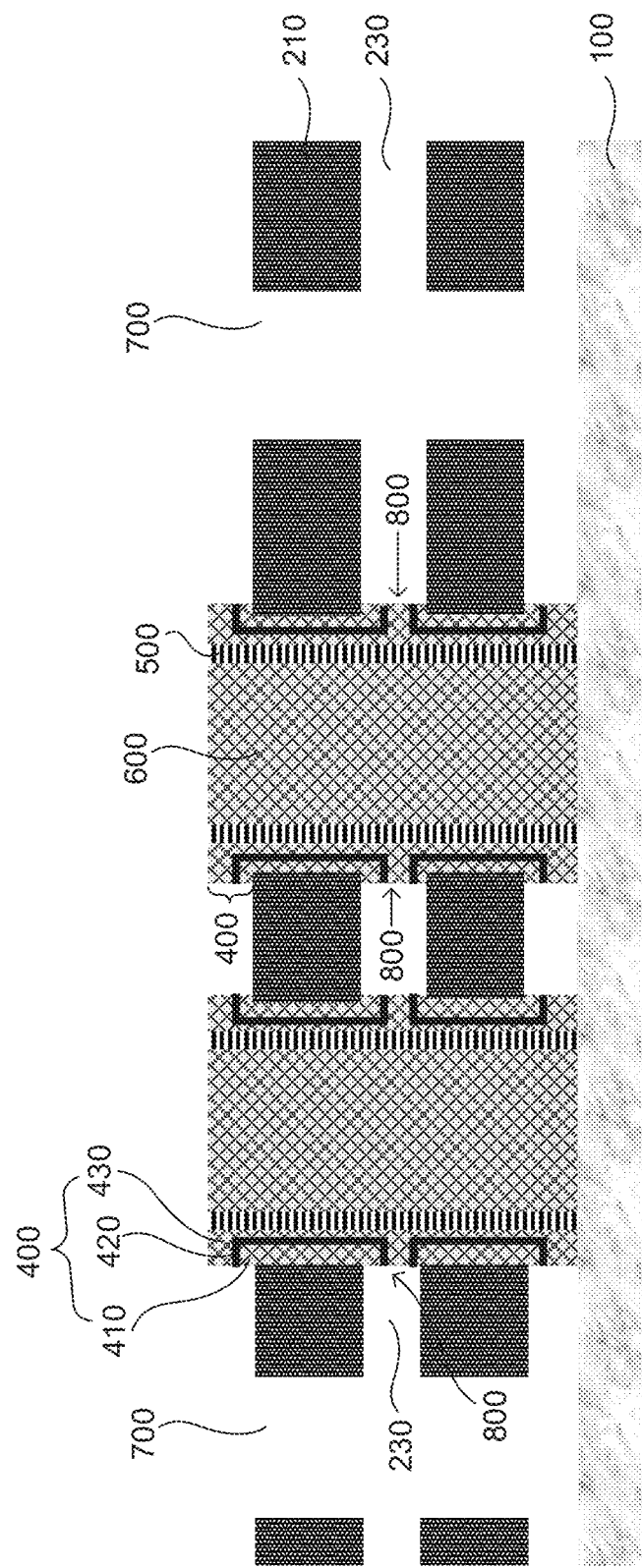

As shown in FIG. 8, portions of the functional layer 400 exposed by the multiple horizontal trenches 230 can be etched to a certain depth by any suitable etching process, e.g., an isotropic dry etch or a wet etch. The etching process can have sufficiently high etching selectivity of the materials of the barrier layer 410 and the storage layer 420 (e.g., the CTF) over the materials of the conductive layers 210 and the channel layers 500, such that the etching process can have minimal impact on the conductive layers 210 and the channel layers 500. The isotropic dry etch and/or the wet etch can remove portions of the barrier layer 410 and the storage layer 420 that are exposed by the multiple horizontal trenches 230. As such, the storage layer 420 (e.g., the CTF) can be cut off at positions 800 and divided into multiple segments thus inhibits charge lateral spreading along the storage layer 420.

Figure 9:
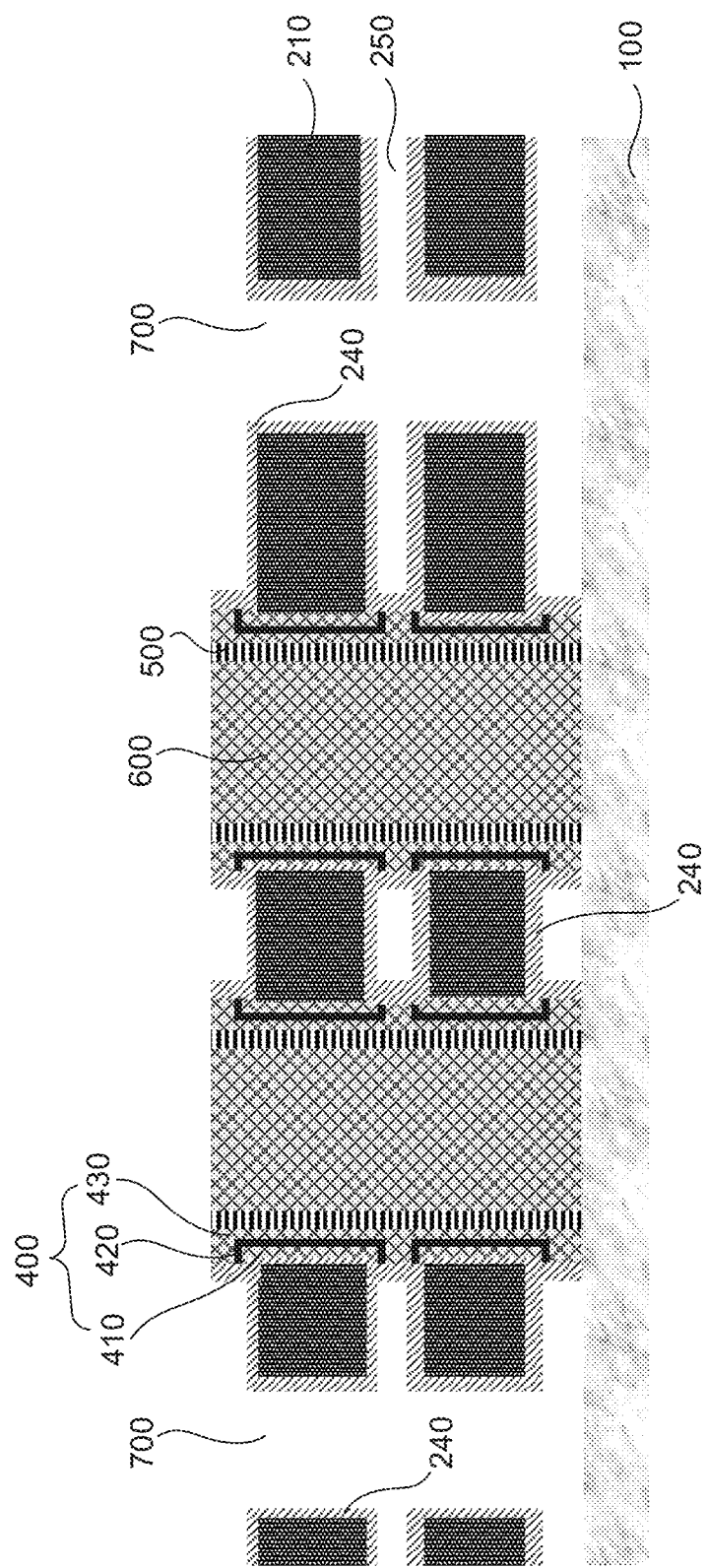

After the operations S116 to divided the storage layer 420, the operation S118 can then be performed to form the insulating layer 240 can be formed to cover the exposed surfaces of the multiple conductive layers 210 and the exposed surfaces of the functional layer 400, as shown in FIG. 9. A detailed description of operation S118 can be referred above in connection with FIG. 7.

It is noted that, any suitable operations can be performed after operation S118 to further fabricate the 3D memory device. For example, a spacer layer (not shown in figures) can be formed on the sidewalls of the multiple slits 700, and a conductive wall (not shown in figures) can be formed in each of the multiple slits 700. The conductive wall can be used as a array common source, and the spacer layer can be used as a gate line spacer to provide electrical insulation between the multiple gates (e.g., the conductive layers 240) and the conductive wall.

Accordingly, a method for forming a 3D memory device is provided in some embodiments in accordance with the present disclosure. In the disclosed method, the storage layer (e.g., the CTF) in the channel hole is formed to have an uneven surface, or further being divided into multiple segments. By doing so, the charge lateral spreading along the CTF can be reduced or inhibited. The disclosed method can significantly improve the cell operation speed and the data retention performance of the 3D memory device. Embodiments of the 3D memory devices fabricated by the disclosed methods are also disclosed herein.

One aspect of the present disclosure provides a method for forming a three-dimensional (3D) NAND memory device, comprising: forming an alternating layer stack on a substrate; forming a plurality of channel holes in the alternating layer stack, each penetrating vertically through the alternating layer stack; forming a functional layer including a storage layer on a sidewall of each channel hole, wherein the storage layer has an uneven surface; forming a channel layer to cover the functional layer in each channel hole; and forming a filling structure to cover the channel layer and fill each channel hole.

In some embodiments, the method further comprises dividing the storage layer into a plurality of segments.

In some embodiments, forming the alternating layer stack comprises forming a plurality of conductive/dielectric layer pairs on the substrate, each conductive/dielectric layer pair comprising a conductive layer and a dielectric layer.

In some embodiments, the method further comprises, before forming the functional layer, etching portions of the dielectric layers exposed by the channel holes to form a plurality of recesses on the sidewall of each channel hole.

In some embodiments, the method further comprises forming a slit penetrating vertically through the alternating layer stack and extending in a horizontal direction; removing the dielectric layers in the alternating layer stack through the slit to form a plurality of horizontal trenches; and forming an insulating layer to cover exposed surfaces of the conductive layers and the functional layer.

In some embodiments, the method further comprises, before forming the insulating layer, removing portions of the functional layer exposed by the multiple horizontal trenches to divide the storage layer into a plurality of segments.

In some embodiments, the method further comprises after forming the slit, forming a doped region below the slit in the substrate; after forming the insulating layer, removing a portion of the insulating layer at a bottom of the silt to expose the doped region; and forming a conductive wall in the silt, so as to electrically contact the conductive wall with the doped region.

In some embodiments, the method further comprises, before forming the functional layer, forming a plurality of recesses on the sidewall of each channel hole.

In some embodiments, forming the functional layer comprises forming a barrier layer on the sidewall of each channel hole for blocking an outflow of the electronic charges during operation; forming the storage layer on a surface of the barrier layer for storing electronic charges during operation; and forming a tunneling layer on a surface of the storage layer for tunneling electronic charges during operation.

In some embodiments, forming the barrier layer comprises forming the barrier layer to cover the sidewall of each channel hole, such that the barrier layer includes a plurality of first corners corresponding to the plurality of recesses on the sidewall of each channel hole.

In some embodiments, forming the storage layer comprises forming the storage layer to cover the barrier layer, such that the storage layer includes a plurality of second corners corresponding to the plurality of first corners of the barrier layer.

In some embodiments, forming the tunneling layer comprises forming the tunneling layer to cover the storage layer, such that the tunneling layer includes a plurality of protrusions each corresponding to a recess on the sidewall of each channel hole.

Another aspect of the present disclosure provides a three-dimensional (3D) NAND memory device, comprising: an alternating layer stack disposed on a substrate; a plurality of channel holes in the alternating layer stack, each penetrating vertically through the alternating layer stack; a functional layer disposed on a sidewall of each channel hole, wherein the functional layer includes a storage layer having an uneven surface; a channel layer disposed to cover the functional layer in each channel hole; and a filling structure disposed to cover the channel layer and fill each channel hole.

In some embodiments, the storage layer includes a plurality of divided segments.

In some embodiments, the alternating layer stack comprises a plurality of conductive/dielectric layer pairs each comprising a conductive layer and a dielectric layer.

In some embodiments, the alternating layer stack comprises a plurality of conductive layers covered by an insulating layer, and a plurality of air gaps between adjacent conductive layers.

In some embodiments, the device further comprises a slit penetrating vertically through the alternating layer stack and extending in a horizontal direction; a doped region in the substrate located adjacent to the slit; and a conductive wall in the silt and in contact with the doped region.

In some embodiments, the functional layer comprises: a barrier layer disposed on the sidewall of each channel hole and configured to blocking an outflow of the electronic charges during operation; the storage layer disposed on a surface of the barrier layer and configured to storing electronic charges during operation; and a tunneling layer disposed on a surface of the storage layer and configured to permit tunneling of electronic charges during operation.

In some embodiments, the barrier layer comprises a plurality of first corners corresponding to the plurality of recesses on the sidewall of each channel hole; the storage layer includes a plurality of second corners corresponding to the plurality of first corners of the barrier layer; and the tunneling layer includes a plurality of protrusions each corresponding to a recess on the sidewall of each channel hole.

In some embodiments, the barrier layer includes an $Al_2O_3$ sublayer and a $SiO_2$ sublayer; the storage layer includes a first SiN sublayer, a first SiON sublayer, a second SiN sublayer, a second SiON sublayer, and a third SiN sublayer; and the tunneling layer includes a first SiO sublayer, a first SiON sublayer, a second SiON sublayer, a third SiON sublayer, and a second SiO sublayer.

Other aspects of the present disclosure can be understood by those skilled in the art in light of the description, the claims, and the drawings of the present disclosure.

The foregoing description of the specific embodiments will so fully reveal the general nature of the present disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections may set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A three-dimensional (3D) NAND memory device, comprising:
   an alternating layer stack disposed on a substrate;
   a plurality of channel holes in the alternating layer stack, each penetrating vertically through the alternating layer stack;
   a functional layer disposed on a sidewall of each channel hole, wherein the functional layer includes:
      a storage layer having an uneven surface, and including a first SiN sublayer;
      a barrier layer includes an $Al_2O_3$ sublayer and a $SiO_2$ sublayer, wherein the $SiO_2$ sublayer of the barrier layer is sandwiched between the $Al_2O_3$ sublayer and the first SiN sublayer of the storage layer, and
      a tunneling layer including a plurality of SiON sublayers sandwiched between a first SiO sublayer and a second SiO sublayer;
   a channel layer disposed to cover the functional layer in each channel hole; and
   a filling structure disposed to cover the channel layer and fill each channel hole.

2. The device of claim 1, wherein:
   the storage layer includes a plurality of divided segments.

3. The device of claim 1, wherein the alternating layer stack comprises:
   a plurality of conductive/dielectric layer pairs each comprising a conductive layer and a dielectric layer.

4. The device of claim 1, wherein the alternating layer stack comprises:
   a plurality of conductive layers covered by an insulating layer; and
   a plurality of air gaps between adjacent conductive layers.

5. The device of claim 1, further comprising:
   a slit penetrating vertically through the alternating layer stack and extending in a horizontal direction;
   a doped region in the substrate located adjacent to the slit; and
   a conductive wall in the slit and in contact with the doped region.

6. The device of claim 1, wherein:
   the barrier layer is disposed on the sidewall of each channel hole and configured to blocking an outflow of the electronic charges during operation;

the storage layer is disposed on a surface of the barrier layer and configured to storing electronic charges during operation; and the tunneling layer is disposed on a surface of the storage layer and configured to permit tunneling of electronic charges during operation.

7. The device of claim 6, wherein:

the hairier layer comprises a plurality of first corners corresponding to the plurality of recesses on the sidewall of each channel hole;

the storage layer includes a plurality of second corners corresponding to the plurality of first corners of the barrier layer; and the tunneling layer includes a plurality of protrusions each corresponding to a recess on the sidewall of each channel hole.

8. The device of claim 6, wherein:

the storage layer further includes a first SiON sublayer, a second SiN sublayer, a second SiON sublayer, and a third SiN sublayer; and the tunneling layer includes a first SiON sublayer, a second SiON sublayer, and a third SiON sublayer that are sandwiched between the first SiO layer and the second SiO sublayer.

9. The device of claim 8, wherein:

a nitrogen concertation is increased from the first SiON sublayer to the second SiON sublayer and to third SiON sublayer.

* * * * *